US012660558B2

(12) United States Patent
Lu et al.

(10) Patent No.: US 12,660,558 B2
(45) Date of Patent: Jun. 16, 2026

(54) ROBOTIC ARM WITH VIBRATION DETECTION AND IMAGE RECOGNITION

(71) Applicant: JUN-FU TECHNOLOGY INC, New Taipei City (TW)

(72) Inventors: Cheng-Hsiang Lu, New Taipei City (TW); Chung-Hsien Lu, New Taipei City (TW); Yao-Tsung Hsueh, New Taipei City (TW); Bo-Wen Lin, New Taipei City (TW)

(73) Assignee: JUN-FU TECHNOLOGY INC, Taipei City (TW)

( * ) Notice: Subject to any disclaimer, the term of this patent is extended or adjusted under 35 U.S.C. 154(b) by 405 days.

(21) Appl. No.: 18/365,236

(22) Filed: Aug. 4, 2023

(65) Prior Publication Data

US 2025/0046636 A1 Feb. 6, 2025

(51) Int. Cl.
| | |
|---|---|
| *H10P 72/00* | (2026.01) |
| *B25J 11/00* | (2006.01) |
| *B25J 19/02* | (2006.01) |
| *G06T 7/00* | (2017.01) |
| *H10P 72/30* | (2026.01) |

(Continued)

(52) U.S. Cl.
CPC ....... *H10P 72/0608* (2026.01); *B25J 11/0095* (2013.01); *B25J 19/021* (2013.01); *G06T 7/0004* (2013.01); *H10P 72/0606* (2026.01); *H10P 72/0616* (2026.01); *H10P 72/3402* (2026.01); *H10P 72/53* (2026.01); *H10P 72/7602* (2026.01); *G06T 2207/30148* (2013.01)

(58) Field of Classification Search
CPC ......... H01L 21/67265; H01L 21/67259; H01L 21/67288; H01L 21/67766; H01L 21/681; H01L 21/68707; B25J 11/0095; B25J 19/021; G06T 7/0004; G06T 2207/30148
See application file for complete search history.

(56) References Cited

U.S. PATENT DOCUMENTS

| | | | | |
|---|---|---|---|---|
| 2004/0095575 | A1* | 5/2004 | Woo .................... | G01N 21/9501 356/300 |
| 2009/0067959 | A1* | 3/2009 | Takahashi ......... | H01L 21/67219 414/226.01 |

(Continued)

*Primary Examiner* — Sohana Tanju Khayer

(74) *Attorney, Agent, or Firm* — Birch, Stewart, Kolasch & Birch, LLP

(57) ABSTRACT

Disclosed in a robotic arm with vibration detection and image recognition, of which a main structure includes a wafer transportation device, a robotic arm rotatably mounted on the wafer transportation device, an image acquiring device arranged on the robotic arm, at least one first vibration detector arranged on the robotic arm, a second vibration detector arranged in an interior of the wafer transportation device, and a monitoring device arranged at one side of the wafer transportation device. The monitoring device includes a status inspecting part in information connection with the image acquiring device and a vibration inspecting part in information connection with the first vibration detector and the second vibration detector. By means of the above structure, the robotic arm is additionally provided with functions of wafer storage status inspecting, impact sensing, and lifespan predicting, so as to prevent mutual influence between machine structure operation instability and inspection error.

9 Claims, 10 Drawing Sheets

(51) Int. Cl.
    *H10P 72/50*          (2026.01)
    *H10P 72/76*          (2026.01)

(56)                References Cited

U.S. PATENT DOCUMENTS

| 2012/0325781 A1* | 12/2012 | Gneiting | B23K 26/706 |
| | | | 206/223 |
| 2017/0312922 A1* | 11/2017 | Unno | B25J 9/1651 |
| 2020/0135518 A1* | 4/2020 | Huang | H10P 72/0462 |
| 2020/0329577 A1* | 10/2020 | Hermann | H04Q 1/025 |
| 2020/0365436 A1* | 11/2020 | Houng | G01N 29/04 |
| 2021/0193490 A1* | 6/2021 | Hung | H01L 21/67757 |
| 2021/0233267 A1* | 7/2021 | Kempf | H04N 13/254 |
| 2021/0299871 A1* | 9/2021 | Hiraide | B25J 9/161 |
| 2023/0084162 A1* | 3/2023 | Jung | B25J 19/022 |
| | | | 700/259 |
| 2025/0042057 A1* | 2/2025 | Bonwetsch | B28B 1/093 |
| 2025/0118528 A1* | 4/2025 | Wieland | H01J 37/28 |
| 2025/0200777 A1* | 6/2025 | Tsuru | H01L 22/00 |

* cited by examiner

91

9     91 normal operation (A) operation abnormality (B)lifespan abnormality (C)external force abnormality

ROBOTIC ARM WITH VIBRATION DETECTION AND IMAGE RECOGNITION

TECHNICAL FIELD OF THE INVENTION

The present invention relates to a robotic arm with vibration detection and image recognition, such that the robotic arm is provided with functions of wafer storage status inspection, impact sensing, and lifespan prediction.

DESCRIPTION OF THE PRIOR ART

Before wafers are removed, it needs to first identify if there is any defective storage status occurring on the wafers disposed in a wafer cassette box, such as missing, lapping, skewing, and warping, in order to prevent damage of the wafers during the process of removing and positioning. Thus, an operation of inspecting the storage status of the wafers in the wafer cassette box is conducted first before the wafers of the entire wafer cassette box are removed. When the wafers show a status of defective loading, removal is temporarily stopped in order to allow a user to release the erroneous status.

Further, in various steps of a wafer manufacturing process, transportation among various pieces of equipment is conducted with a robotic arm. Although it is known that a robotic arm may be subjected to inspect moving accuracy thereof with known means in order to prevent unexpected damage to the wafers, no monitoring equipment has been known for guaranteeing situations in respect of frequency and behavior of the mechanical operations thereof, so that there is no way to prevent risks of quality deterioration of the wafers due to being influenced by abnormality of the mechanical operations.

Thus, an operation abnormality of a robotic arm may raise the chance of damage of wafers during a process of transportation of the wafers, or lead to reduce efficiency of mechanical operations, or even abnormal movement, which may then affect the operation of inspecting the storage status of the wafers in a wafer cassette box. On the other hand, the accuracy of recognition of the wafer storage status may reversely affect the operation frequency, path planning, and operation efficiency of the robotic arm.

The above-described robotic arm, during use, suffers the following shortcomings to be further improved:

It does not integrate an operation of inspecting a storage status of a wafer with identifying abnormality of machine operation thereof, so as to cause mutual influence between mechanical structure operation instability and inspection error.

SUMMARY OF THE INVENTION

The primary objective of the present invention is to use an image acquiring device and first and second vibration detectors to provide a robotic arm with additional functions of wafer storage status inspecting, impact sensing, and lifespan predicting in order to prevent mutual influence between machine structure operation instability and inspection error to thereby enhance accuracy of moving and identifying.

To achieve the above objective, a main structure of the present invention comprises: a wafer transportation device, a robotic arm, an image acquiring device, at least one first vibration detector, a second vibration detector, a monitoring device, a status inspecting part, and a vibration inspecting part, wherein the robotic arm is rotatably mounted on the wafer transportation device; the image acquiring device is arranged on the robotic arm and has an image acquiring direction that is kept consistent with a gripping direction of the robotic arm to acquire a wafer image; the first vibration detector is arranged on the robotic arm; the second vibration detector is arranged in an interior of the wafer transportation device; the monitoring device is arranged at one side of the wafer transportation device; the status inspecting part is in information connection with the image acquiring device, and the vibration inspecting part is in information connection with the first vibration detector and the second vibration detector; and the status inspecting part is operable to identify a storage status of the wafer in respect of wafer missing, wafer skewing, wafer lapping, position, and edge warping according to the wafer image.

To use, the image acquiring device is arranged on the robotic arm of the wafer transportation device and the image acquiring direction is set consistent with the gripping direction of the robotic arm, so that before each gripping of a wafer, the status inspecting part of the monitoring device and the wafer image of each of the wafers can be applied to determine if the storage status of each of the wafers is normal, and during a course of use of the robotic arm, the first vibration detector, the second vibration detector, and the vibration inspecting part are applied to provide functions in respect of inspection of an impact situation of the robotic arm, prediction of vibration of the wafer on the robotic arm, inspection of operation condition of the wafer transportation device, prediction of component lifespan. By means of integration of happening abnormality situations with the monitoring device, mutual influence between machine structure operation instability and inspection error can be prevented so as to enhance accuracy of moving and identifying.

By means of the above technology, the problem that a prior art robotic arm does not combine an operation of inspecting a storage status of a wafer with identifying of abnormality of machine operation itself to thereby result in mutual influence between machine structure operation instability and inspection error to thereby enhance accuracy of moving and identifying can be overcome to thereby achieve practical progress for the above-noted advantages.

DETAILED DESCRIPTION OF THE PREFERRED EMBODIMENT

Figure 1:
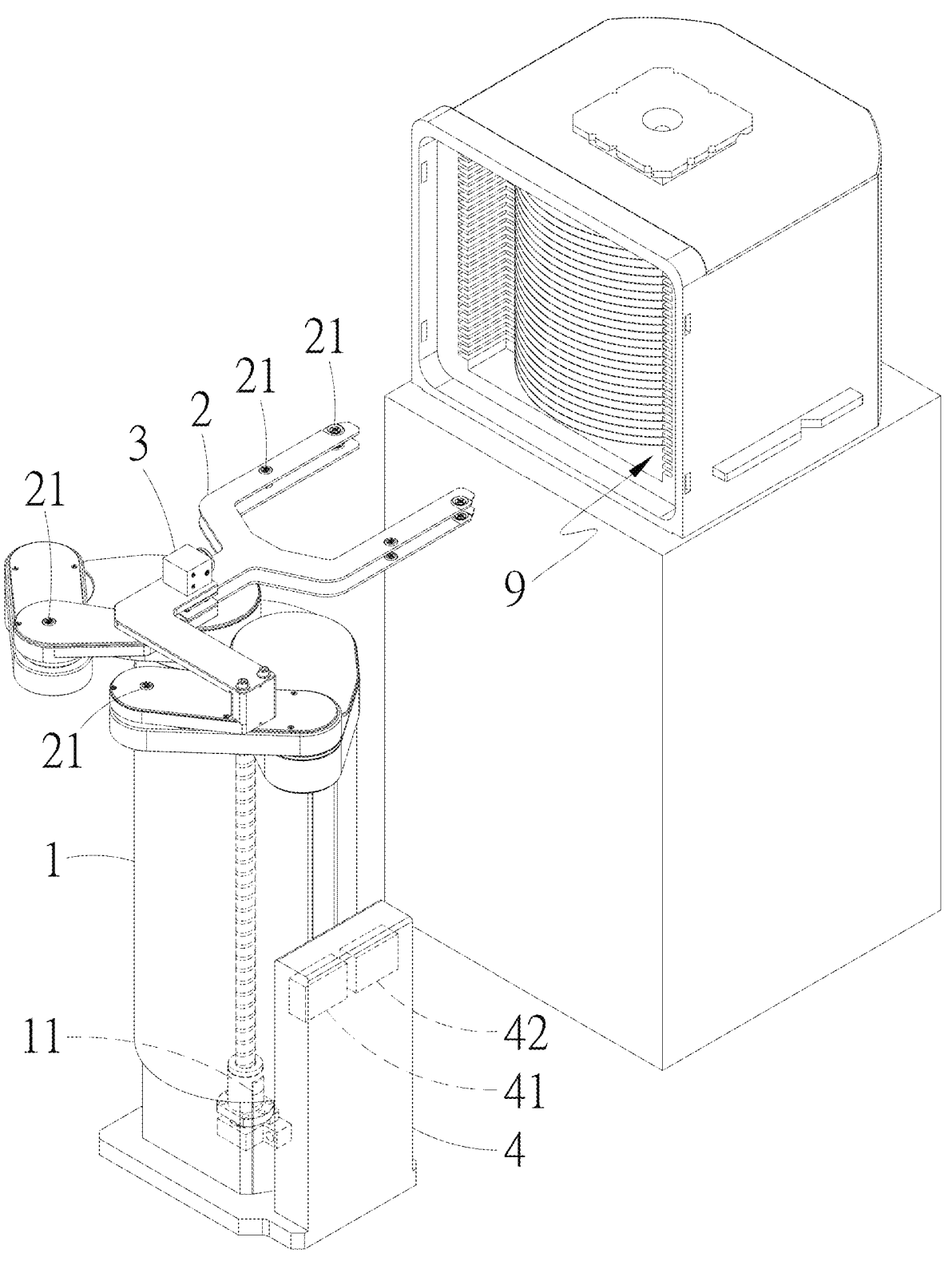
FIG. 1 is a perspective view showing a preferred embodiment of the present invention.
Figure 2A:
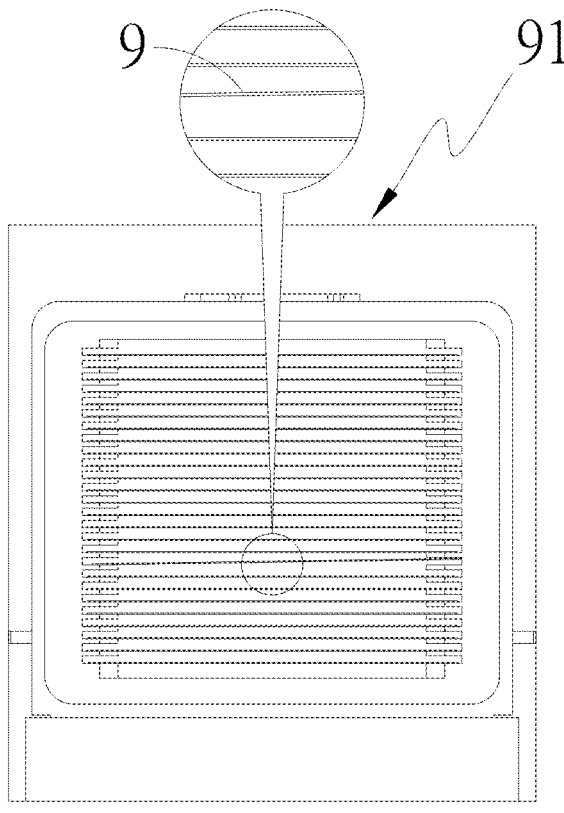
FIG. 2A is a first schematic view illustrating a wafer storage status of the preferred embodiment of the present invention.
Figure 2B:
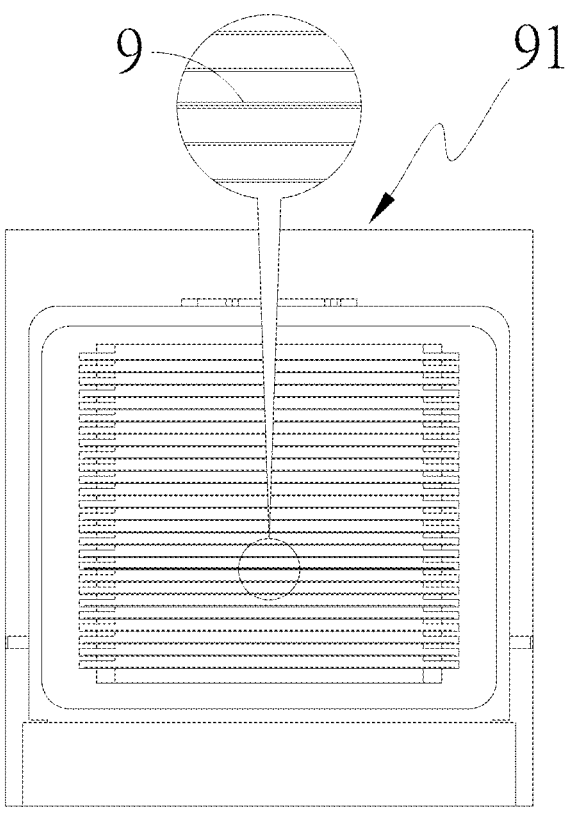
FIG. 2B is a second schematic view illustrating a wafer storage status of the preferred embodiment of the present invention.
Figure 2C:
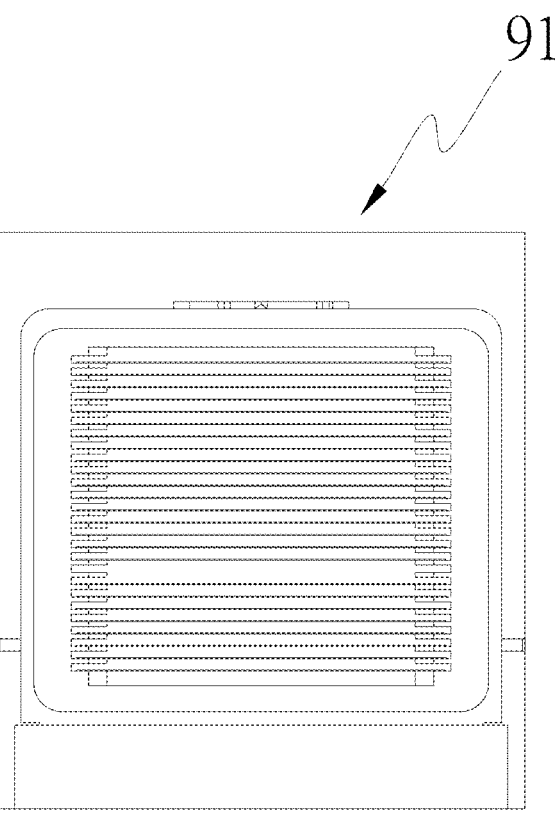
FIG. 2C is a third schematic view illustrating a wafer storage status of the preferred embodiment of the present invention.
Figure 2D:
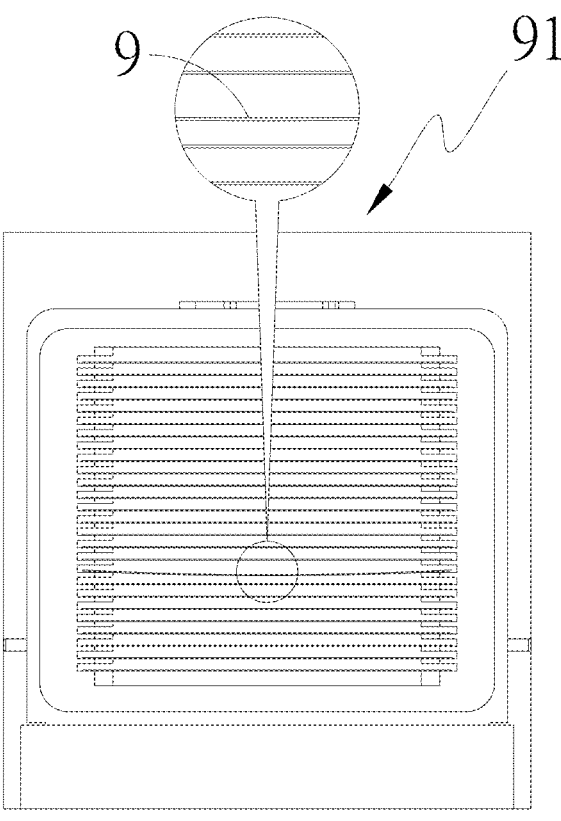
FIG. 2D is a fourth schematic view illustrating a wafer storage status of the preferred embodiment of the present invention.
Figure 3:
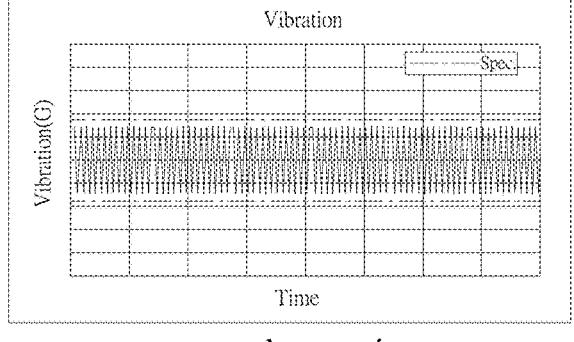
FIG. 3 is a schematic view illustrating vibration monitoring in the preferred embodiment of the present invention.
Figure 3:
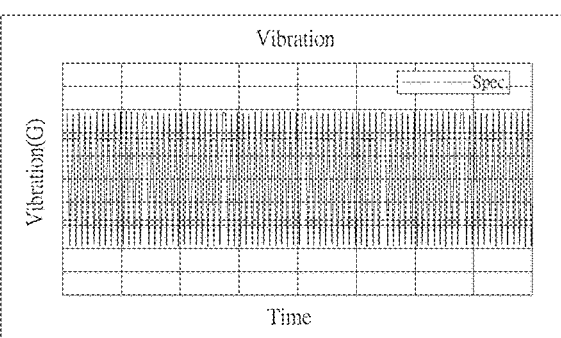
Figure 3:
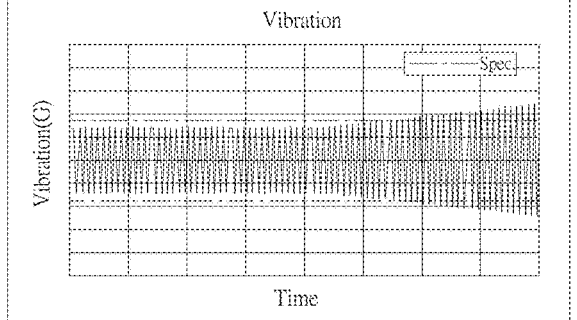
Figure 3:
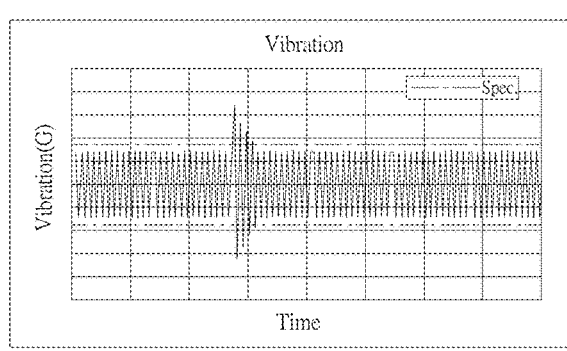

Referring to FIGS. 1-3, which show from a perspective view to a schematic view of vibration monitoring of a preferred embodiment of the present invention, it is clearly seen from the drawings that the present invention includes:

a wafer transportation device 1, wherein an equipment front end module (EFEM) is taken as an example in the instant embodiment;

a robotic arm 2, which is rotatably mounted on the wafer transportation device 1 to grip a wafer 9;

an image acquiring device 3, which is arranged on the robotic arm 2 and has an image acquiring direction that is kept consistent with a gripping direction of the robotic arm 2 to acquire a wafer image 91, wherein a camera is taken an example of the image acquiring device 3 in the instant embodiment;

at least one first vibration detector 21, which is arranged on the robotic arm 2;

a second vibration detector 11, which is arranged in an interior of the wafer transportation device 1, wherein relative electrical detectors are taken as an example for the first vibration detector 21 and the second vibration detector 11 in the instant embodiment and are a single freedom oscillation system constructed of a spring, a damper, and an inertia mass block having a primary function of monitoring a rotating machine vibration state of, each device having its own vibration standard, an exceeding vibration value indicating a machine abnormality; and a monitoring device 4, which is arranged at one side of the wafer transportation device 1 and comprises a status inspecting part 41 in information connection with the image acquiring device 3 and a vibration inspecting part 42 in information connection with the first vibration detector 21 and the second vibration detector 11, and the status inspecting part 41 identifies a storage status of the wafer 9 including wafer missing, wafer skewing, wafer lapping, position, and edge warping according to the wafer image 91, wherein a man-machine interface that is arranged on the wafer transportation device 1 is taken as an example of the monitoring device 4 in the instant embodiment, and processors of the man-machine interface are taken as an example for the status inspecting part 41 and the vibration inspecting part 42.

Based on the described above, the structure of the technology can be appreciated, and based on a corresponding combination of such a structure, the robotic arm 2 is made including various functions of storage state inspection of the wafer 9, impact sensing, and lifespan prediction, and by means of the combination of the above components, it is clear from the drawings that structurally, it only needs to mount an image acquiring device 3 on the robotic arm 2 of the wafer transportation device 1, and have the wafer transportation device 1 controlling the image acquiring device 3, and in installation, the image acquiring direction of the image acquiring device 3 is set consistent with the gripping direction of the robotic arm 2, and thus, as such, no matter what the wafer 9 to be gripped by the robotic arm 2 is in which direction or at what height, the image acquiring device 3 is always move and swing in synchronization with the robotic arm 2, so that one single set of image acquiring device 3 is capable of recognizing the storage state of the wafer 9.

In a practical use, before the robotic arm 2 actually carries out gripping, one that stores multiple wafers 9 and is confirmed of being free of a state of storage abnormality is provided first for recognition, and reference data of a standard storage status are provided, in advance, to the status inspecting part 41, and similarly, other possible abnormal storage statuses are also stored in the status inspecting part 41. FIGS. 2A-2D show wafer images 91 in various abnormal storage statuses, where FIG. 2A is a schematic view showing a skewing storage status of a wafer 9; FIG. 2B is a schematic view showing a lapping storage status of a wafer 9; FIG. 2C is a schematic view showing a missing storage status of a wafer 9; and FIG. 2D is a schematic view showing a warping storage status of a wafer 9.

For vibration sensing, in the instant embodiment, the first vibration detectors 21 are respectively set up at middle sections and end sections of the robotic arm 2, so that the number is four, and in the instant embodiment, the robotic arm 2 is of a two-layered design, so that the total number is eight, and it can even such that two additional first vibration detectors 21 are arranged on a multi-axis arm where impact may readily occur, so that the total number becomes ten; and the second vibration detector 11 is arranged on an ascending/ descending mechanism of the wafer transportation device 1, so as to, through individual detection of variation of the vibration frequency behaviors of the two, monitor whether components have installation or setting abnormality (frequency stability exceeding a standard), or whether aging of components occurs (frequency gradually exceeding a standard), or whether there is external force impacting (frequency instantaneously exceeding a standard), such as in FIG. 3, the operation abnormality shown in part (A), lifespan abnormality shown in part (B), and external force abnormality shown in part (C).

Finally, the monitoring device 4 is applied to collect and record all the detection data to guarantee quality and safety of a process of transportation of the wafer 9 by the robotic arm 2 and to guarantee the quality of the wafer 9 is not affected while monitoring conditions of the wafer transportation device 1 and the robotic arm 2 in order to carry out preventive maintenance and service. In this way, advanced inspection of the storage status of the wafer 9 is carried out before gripping is carried out with the robotic arm 2, in order to prevent damage of a wafer 9 caused by improper gripping or accidental impact by the robotic arm 2, and also to prevent normal gripping being impossible at the time when the robotic arm 2 has moved to a front side of a selected wafer 9 to thereby reduce redundant movement of the robotic arm 2 to indirectly enhance the service life of the wafer transportation device 1, and on the other hand, functions of inspecting an impact condition of the robotic arm 2, predicting vibration of the wafer 9 on the robotic arm 2, inspecting an operation condition of the wafer transportation device 1, and predicting component lifespans can help prevent erroneously determining a storage status of a wafer 9 or even damage of the wafer 9 itself resulting from instability of machine operations during the course of transportation of the wafer 9.

Figure 4:
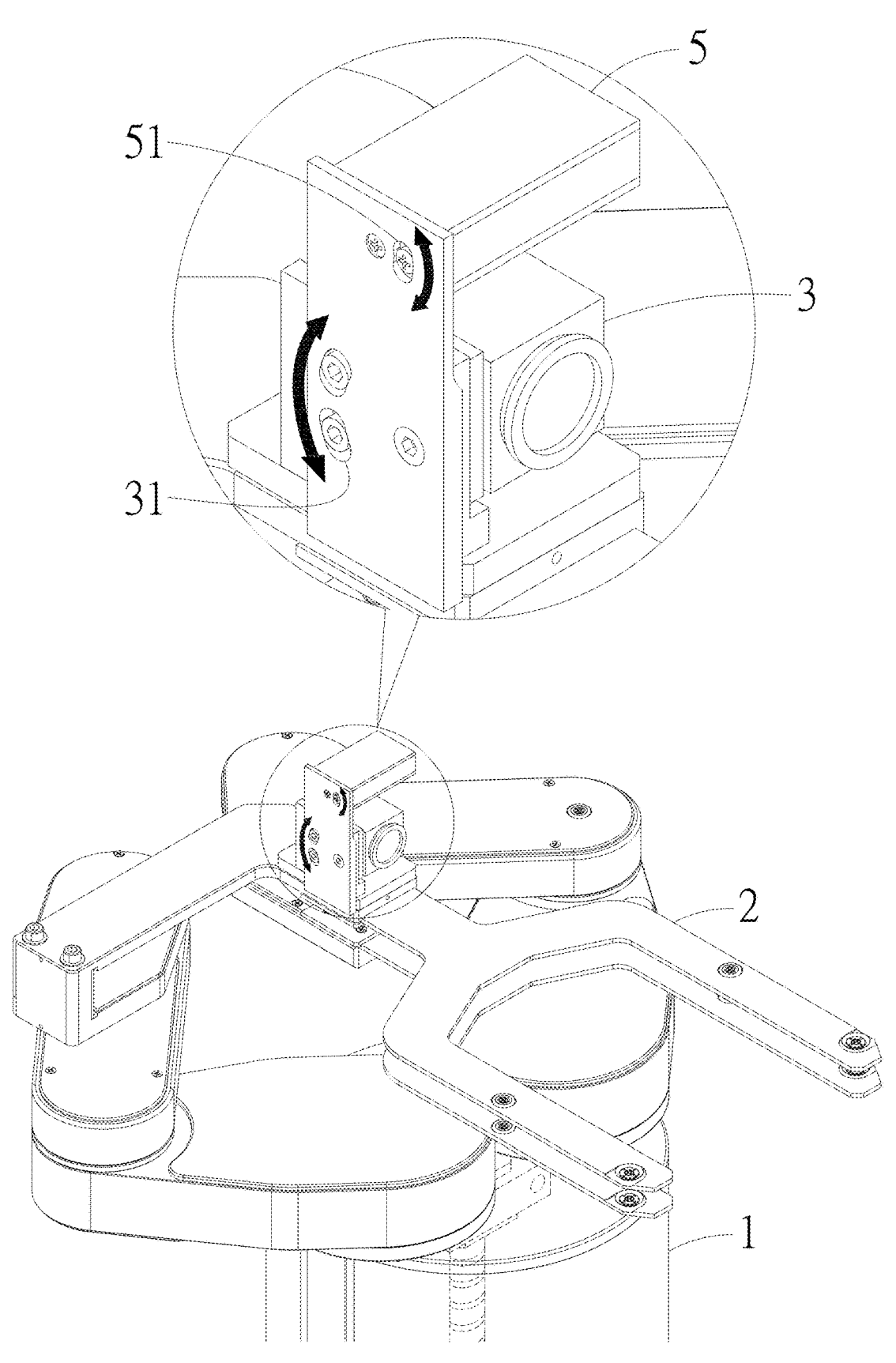
FIG. 4 is a schematic view illustrating implementation of another preferred embodiment of the present invention.
Figure 5:
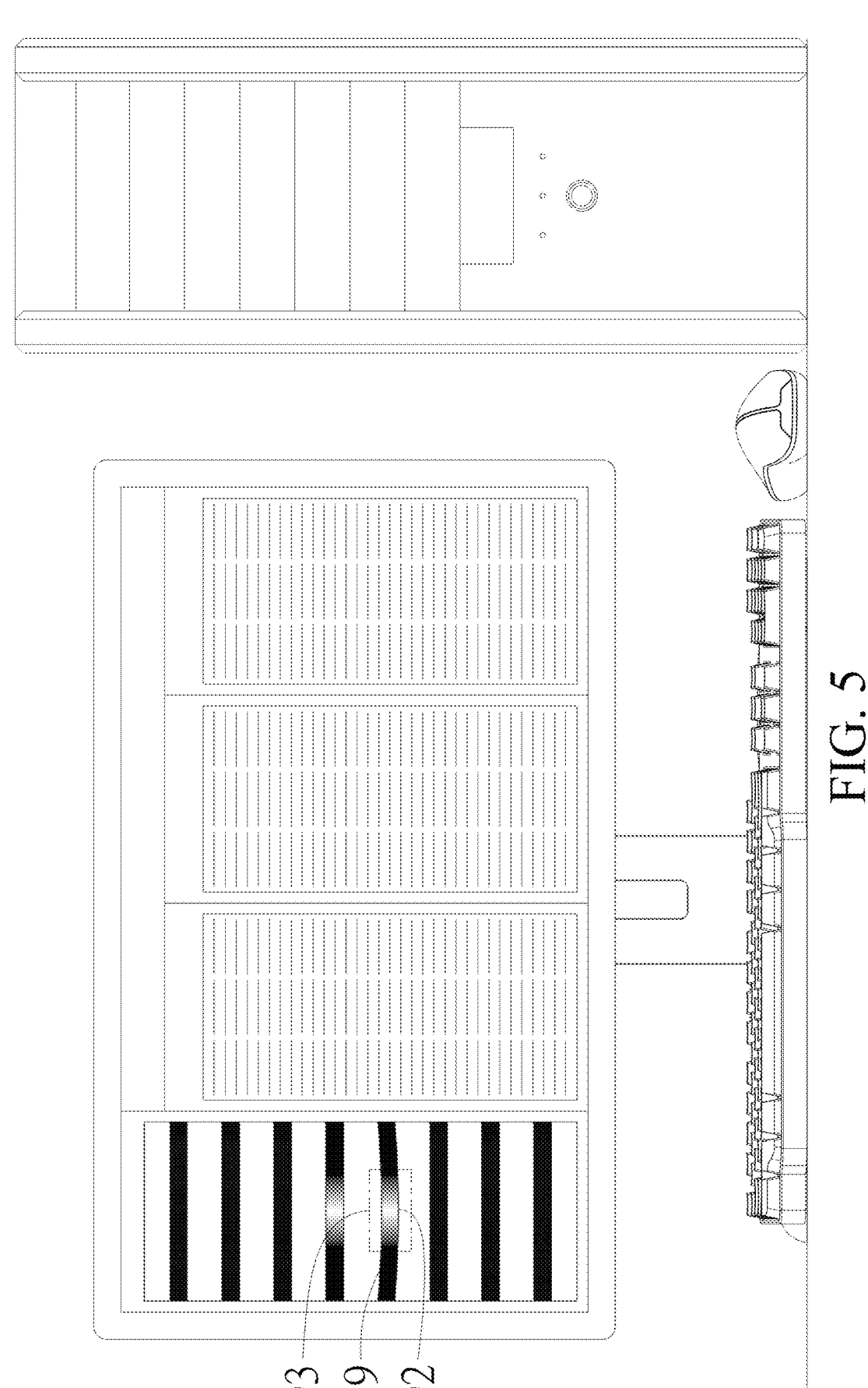
FIG. 5 is a schematic view illustrating a wafer contour image in said another preferred embodiment of the present invention.

Referring to FIGS. 4 and 5, which are respectively a schematic view of implementation and a schematic view of wafer contour image according to another preferred embodiment of the present invention, it is clear from the drawings that the instant embodiment is generally similar to the previous embodiment and is only such that a flashing device 5 is arranged at one side of the image acquiring device 3 and has a lighting direction kept in consistent with the image acquiring direction and is operable to drive the image acquiring device 3 so that when light is projected on the wafer 9, a light-reflecting contour 92 is developed on the wafer 9, and the image acquiring device 3 acquires a wafer contour image 93, and the image acquiring device 3 is provided with at least one first angle adjusting member 31 and the flashing device 5 is provided with at least one second angle adjusting member 51.

The image acquiring device 3 and the flashing device 5 are similarly controlled by the wafer transportation device 1, and on the basis of the image acquiring direction of the image acquiring device 3 being kept consistent with the gripping direction of the robotic arm 2, the lighting direction of the flashing device 5 is set consistent with the image acquiring direction, so that the flashing device 5 is also set to move and swing in synchronization with the robotic arm 2, and thus, one single set of image acquiring device 3 and flashing device 5 is capable of recognizing the storage status of the wafer 9. With the flashing device 5 so added, a recognition operation is such that light is projected onto the wafer 9 to generate a light-reflecting contour 92 on the wafer 9, and the image acquiring device 3 is also driven to acquire an image of the light-reflecting contour 92, and as shown in FIG. 5, the left-side portion of the screen is an acquiring range of the image acquiring device 3, and for a wafer 9 in a direct illuminating range of light of the flashing device 5, a front edge thereof develops a light-reflecting contour 92, and the image acquiring device 3 carries out image acquisition for the light-reflecting contour 92 to generate a wafer contour image 93 (as marked by the phantom line frame), and finally, the status inspecting part determines the storage status of the wafer 9 based on comparison of the wafer contour image 93 with the reference data of the standard storage status. By means of the operation of recognition carried out with the flashing device 5, message contents and data amount of the comparison data can be simplified, and specifically, applying the wafer contour image 93 to carry out recognition for an edge warping status allows for more accurately identify an abnormal storage status for edge warping.

Further, in the instant embodiment, the first angle adjusting member 31 and the second angle adjusting member 51 are combined with a metal plate and are each in the form of a hollow arc track to allow bolts to freely adjust angular positions of the image acquiring device 3 and the flashing device 5, and since it only needs to install one such flashing device 5 in the present invention, operation of angular adjustment is extremely simple, and there is no need for synchronization and alignment with other light sources, and there is also no concern about accuracy of shadow recognition.

Figure 6:
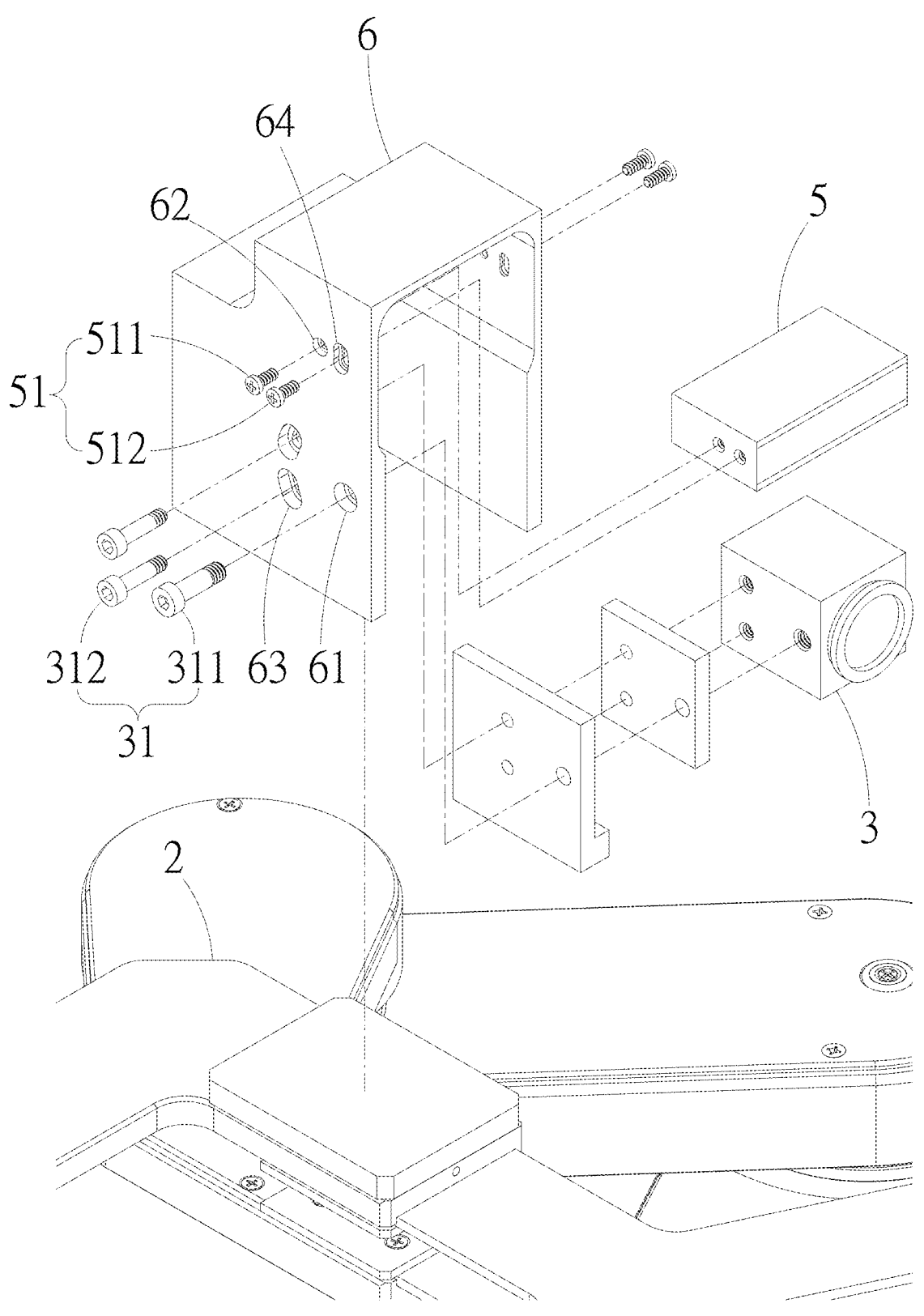
FIG. 6 is an exploded view showing a further preferred embodiment of the present invention.
Figure 7:
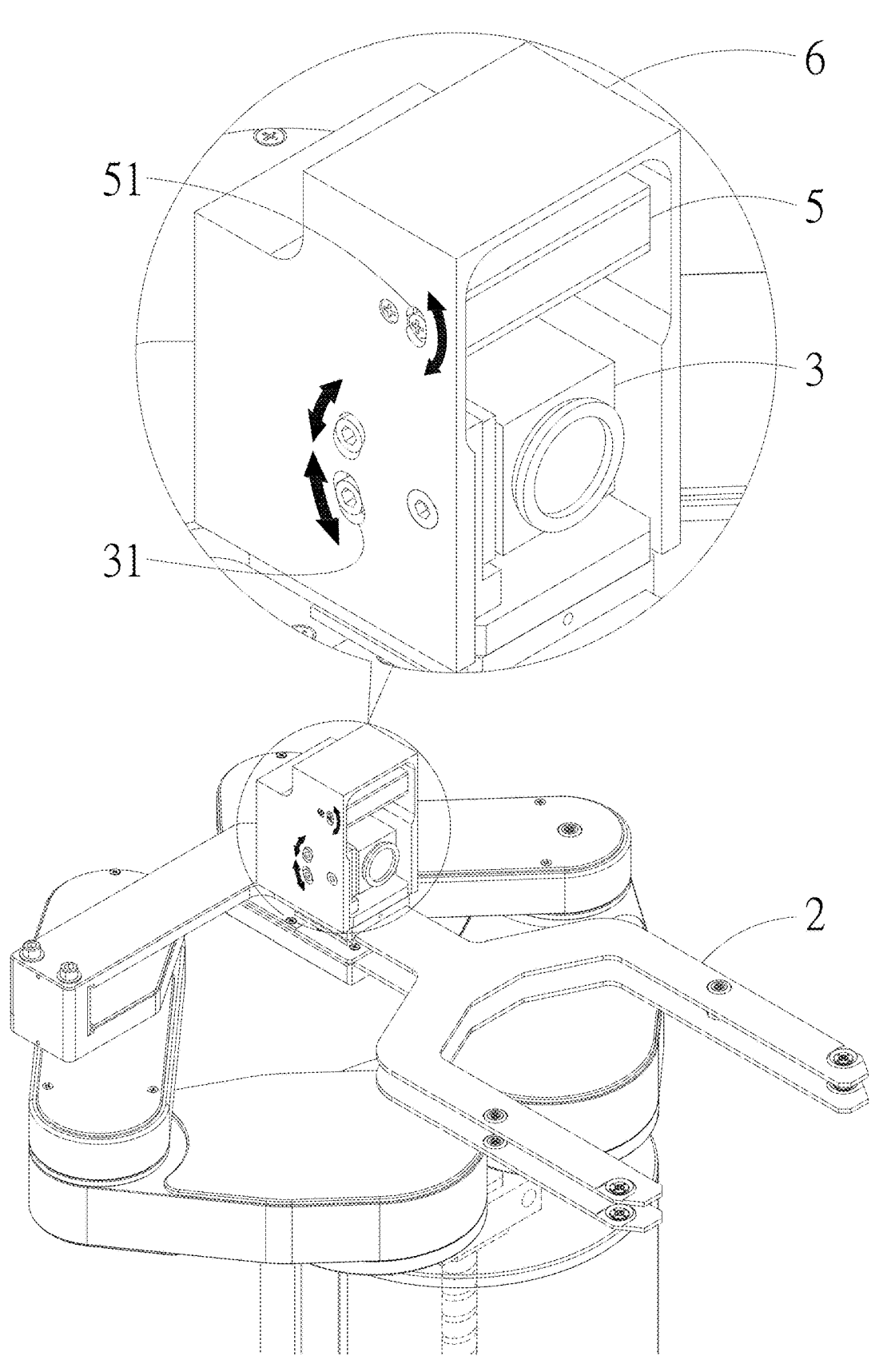
FIG. 7 is a schematic view illustrating implementation of said further preferred embodiment of the present invention.

Referring to FIGS. 6 and 7, which are respectively an exploded view and a schematic view of implementation of a further preferred embodiment of the present invention, it is clear from the drawings that the instant embodiment is generally similar to the previous embodiments and is only such that a protective enclosure 6 is arranged on the robotic arm 2, and the image acquiring device 3 and the flashing device 5 are arranged in an interior of the protective enclosure 6, and the way of installation of the instant embodiment is that the image acquiring device 3 is arranged in the interior of the protective enclosure 6 by means of the first angle adjusting member 31, and the flashing device 5 is arranged in the interior of the protective enclosure 6 by means of the second angle adjusting member 51, and consequently, the protective enclosure 6 is formed with a first positioning hole 61, a second positioning hole 62, at least one first arc hole 63 formed at one side of the first positioning hole 61, and at least one second arc hole 64 formed at one side of the second positioning hole 62, and the first angle adjusting member 31 is arranged on the protective enclosure 6 and comprises a first rotation axle 311 that is mounted in the first positioning hole 61 and at least one first adjusting part 312 fastened to the first arc hole 63, and the second angle adjusting member 51 is arranged on the protective enclosure 6 and comprises a second rotation axle 511 mounted in the second positioning hole 62 and at least one second adjusting part 512 fastened to the second arc hole 64.

In such an arrangement, the first rotation axle 311 is mounted to the first positioning hole 61 to serve as a positioning center for the image acquiring device 3 to be positioned on and fixed to the protective enclosure 6, and the first adjusting part 312 is fastened to the first arc hole 63 to serve as a secondary fixing point after adjustment of the angle of the image acquiring device 3, and similarly, the second rotation axle 511 is mounted to the second positioning hole 62 to serve as a positioning center for the flashing device 5 to be positioned on and fixed to the protective enclosure 6, and the second adjusting part 512 is fastened to the second arc hole 64 to serve as a secondary fixing point after adjustment of the angle of the flashing device 5. In other words, the way of installation of the instant embodiment is such that the image acquiring device 3 is arranged in the interior of the protective enclosure 6 by means of the first angle adjusting member 31 and the flashing device 5 is arranged in the interior of the protective enclosure 6 by means of the second angle adjusting member 51, and the protective enclosure 6 is an enclosure in the form of an inverted U-shape and can be directly mounted to the robotic arm 2 after the installation of the image acquiring device 3 and the flashing device 5 thereon, and a similar advantage of simple structure and easy installation can be achieved, and the protective enclosure 6 can further achieve effects of impact protection, dust protection, and aesthetics for the image acquiring device 3 and the flashing device 5.

We claim:

1. A robotic arm with vibration detection and image recognition, comprising:

a wafer transportation device;

a robotic arm, which is rotatably mounted on the wafer transportation device to grip a wafer;

an image acquiring device, which is arranged on the robotic arm and has an image acquiring direction that is kept consistent with a gripping direction of the robotic arm to acquire a wafer image;

at least one first vibration detector, which is arranged on the robotic arm and configured to detect a vibration frequency generated by movements of the robotic arm;

a second vibration detector, which is arranged in an interior of the wafer transportation device and configured to detect a vibration frequency generated by movements of the wafer transportation device; and a monitoring device, which is arranged at one side of the wafer transportation device and comprises a status inspecting part in information connection with the image acquiring device and a vibration inspecting part in information connection with the first vibration detector and the second vibration detector, wherein the status inspecting part is operable to identify a storage status of the wafer in respect of wafer missing, wafer skewing, wafer lapping, position, and edge warping according to the wafer image, and wherein the vibration inspecting part is operable to determine whether a mechanical operation of the robotic arm and the wafer transportation device is abnormal according to the vibration frequency generated by movements of the robotic arm and the vibration frequency generated by movements of the wafer transportation device.

2. The robotic arm with vibration detection and image recognition according to claim 1, wherein a flashing device is arranged at one side of the image acquiring device and has a lighting direction that is consistent with the image acquiring direction, and is operable to drive the image acquiring device, so that when light is projected onto the wafer, a light-reflecting contour is developed on the wafer, and the image acquiring device is operable to acquire a wafer contour image.

3. The robotic arm with vibration detection and image recognition according to claim 1, wherein the image acquiring device is provided with at least one first angle adjusting member.

4. The robotic arm with vibration detection and image recognition according to claim 2, wherein the flashing device is provided with at least one second angle adjusting member.

5. The robotic arm with vibration detection and image recognition according to claim 2, wherein a protective enclosure is arranged on the robotic arm, and the image acquiring device and the flashing device are arranged in an interior of the protective enclosure.

6. The robotic arm with vibration detection and image recognition according to claim 5, wherein the image acquiring device comprises at least one first angle adjusting member arranged on the protective enclosure.

7. The robotic arm with vibration detection and image recognition according to claim 6, wherein the protective enclosure is formed with a first positioning hole and at least one first arc hole formed at one side of the first positioning hole, and the first angle adjusting member comprises a first rotation axle mounted in the first positioning hole and at least one first adjusting part fastened to the first arc hole.

8. The robotic arm with vibration detection and image recognition according to claim 5, wherein the flashing device comprises at least one second angle adjusting member arranged on the protective enclosure.

9. The robotic arm with vibration detection and image recognition according to claim 8, wherein the protective enclosure is formed with a second positioning hole and at least one second arc hole formed at one side of the second positioning hole, and the second angle adjusting member comprises a second rotation axle mounted in the second positioning hole and at least one second adjusting part fastened to the second arc hole.

* * * * *